(12) United States Patent
Shinohara et al.

(10) Patent No.: US 6,292,363 B1
(45) Date of Patent: Sep. 18, 2001

(54) SERVO AMPLIFIER UNIT

(75) Inventors: Tatsuo Shinohara; Hideyuki Nakamura; Naoyuki Suzuki; Kiichi Inaba; Makoto Takeshita, all of Minamitsuru-gun (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 09/292,920

(22) Filed: Apr. 16, 1999

(30) Foreign Application Priority Data

Apr. 16, 1998 (JP) .................................................. 10-121640

(51) Int. Cl.$^7$ ...................................................... H05K 7/20
(52) U.S. Cl. .................. 361/695; 165/104.33; 174/15.2; 361/700; 361/715
(58) Field of Search ...................... 165/104.33; 174/15.2; 361/688, 700, 694–695, 715; 363/141

(56) References Cited

U.S. PATENT DOCUMENTS

| 4,177,499 | 12/1979 | Volkmann . |
| 5,297,025 | 3/1994 | Shoquist et al. . |
| 5,508,908 | * 4/1996 | Kazamma et al. .................... 361/704 |

FOREIGN PATENT DOCUMENTS

| 01013751 | 1/1989 | (EP) . |
| 02013266 | 1/1990 | (EP) . |
| 02290098 | 11/1990 | (EP) . |
| 07222458 | 8/1995 | (EP) . |
| 2-290098 | 11/1990 | (JP) . |
| 2-290099 | 11/1990 | (JP) . |
| 7-7994 | 1/1995 | (JP) . |
| 7-39167 | 2/1995 | (JP) . |
| 7-222458 | 8/1995 | (JP) . |
| 7-297561 | 11/1995 | (JP) . |
| 8-186388 | 7/1996 | (JP) . |
| 8-289566 | 11/1996 | (JP) . |
| 9-28094 | 1/1997 | (JP) . |
| 7-235786 | 11/1997 | (JP) . |
| 148977 | 9/1999 | (JP) . |

* cited by examiner

Primary Examiner—Gregory Thompson
(74) Attorney, Agent, or Firm—Staas & Halsey LLP

(57) ABSTRACT

A semiconductor module is mounted on a printed circuit board so that a heat radiating surface of the module and surfaces of the printed circuit boards are parallel to inner wall surfaces of a unit case. The total thickness of the semiconductor module constituting an inverter essential to a servo amplifier, and the printed circuit boards on which the semiconductor module is mounted is made substantially equal to a distance between the inner walls of the unit case so that the width of the servo amplifier can be minimized. The other components having sizes smaller than the width of the unit case are selected, and an electrolytic capacitor and the like are divided into a plurality of parts so that the divided parts are separately accommodated. Further, air passages are defined by guide plates closing gaps between the components, so that air is impinge concentratedly on components which need to be cooled during forced air cooling by fans, whereby the cooling efficiency is enhanced, permitting dense arrangement of the components and making it possible to provide a servo amplifier reduced in thickness and in size.

4 Claims, 5 Drawing Sheets

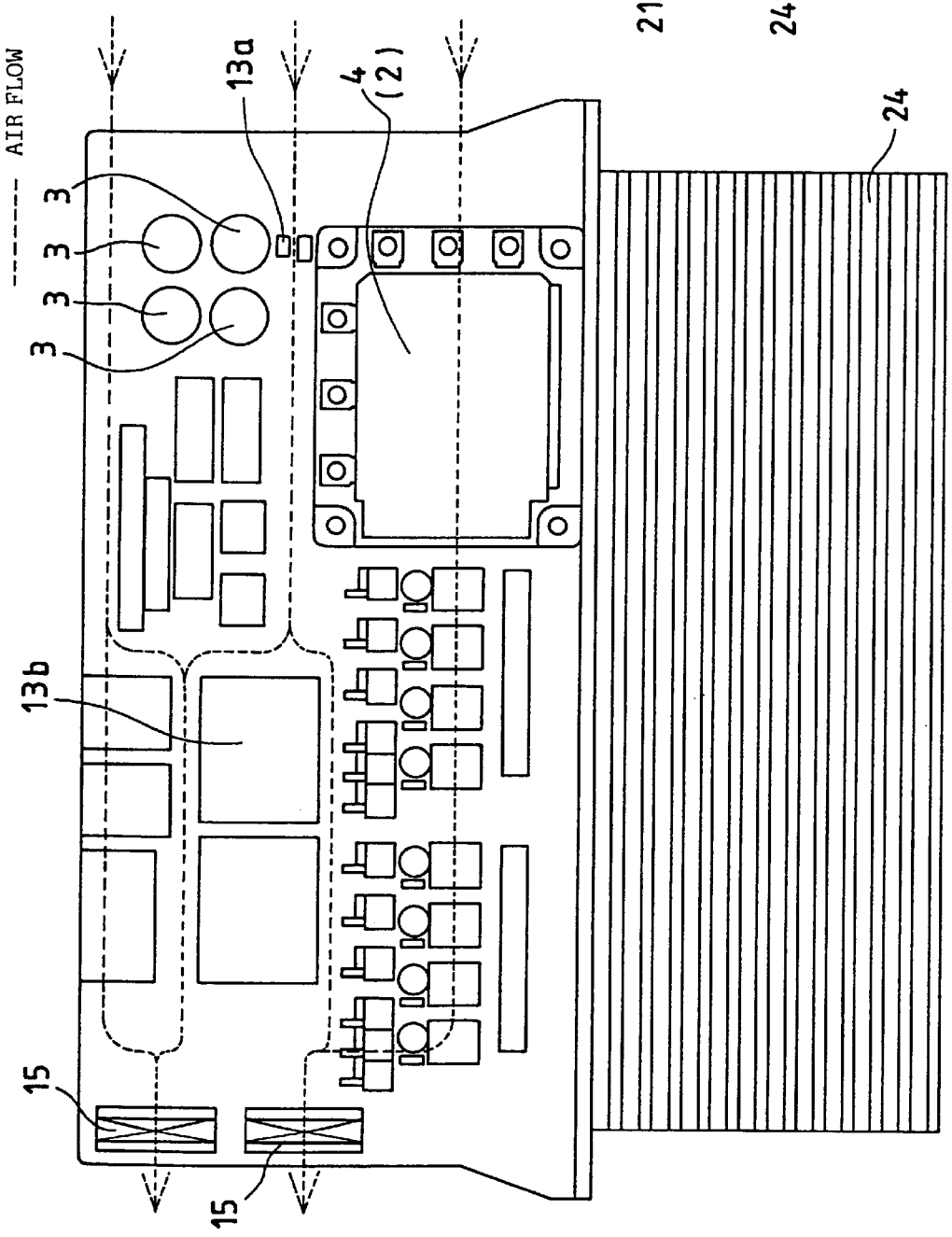

SERVO AMPLIFIER UNIT

BACKGROUND OF THE INVENTION

1. Field of the Invention

The present invention relates to a servo amplifier for use in a controller for various industrial machinery such as a machine tool, a robot, an injection molding machine, a wire electric discharge machine and an electrical press machine.

2. Description of the Related Art

FIG. 7 illustrates a circuitry structure of a servo amplifier generally known in the art. An alternating current from a three-phase alternating-current power supply 1 is converted to a direct current by a semiconductor module 2 constituted by a rectifier circuit such as a diode bridge circuit, and then smoothed by an electrolytic capacitor 3. Subsequently, the direct current is converted into a desired alternating current under PWM control by a semiconductor module 4 and a control circuit 5 which constitute an inverter circuit, so as to drive control a servomotor 6. In FIG. 7, a circuit A 7 includes a charging circuit for gradually charging the electrolytic capacitor 3 when the power supply is turned on, a circuit B 8 includes a direct-current voltage detection circuit and a dynamic braking circuit for absorbing a regenerative current, a circuit C 9 includes a current detection circuit, and a circuit D 10 includes circuits for dynamic braking and for detecting electric current.

A general servo amplifier is constituted by parts or components shown in FIG. 7 except the three-phase power supply 1 and the servomotor 6, that is, the semiconductor modules 2 and 4, the control circuit 5, the electrolytic capacitor 3 and the circuits 7 to 10. In some servo amplifiers, the semiconductor module 2 constituting a rectifier circuit is not accommodated in the same unit case which contains the other parts or components. In the servo amplifier described above, the semiconductor modules 2 and 4 are components which mainly generate heat, although the circuits 7–10 include heat generating parts.

FIG. 4 is a diagram of the amplifier having the above-described servo amplifier circuitry as viewed from the bottom of the amplifier for showing the internal arrangement thereof.

The aforementioned parts or components constituting the servo amplifier are separately mounted on two printed circuit boards 11 and 12 which are arranged opposite to each other. One or both of the semiconductor modules 4 and 2 are mounted on the printed circuit board 11 or 12 so that heat radiating surfaces 4a and 2a thereof are parallel to the printed circuit board 11, 12. In the example shown in FIG. 4, one or both of the semiconductor modules are mounted on the printed circuit board 11. The heat radiating surface 4a, 2a of the semiconductor module 4, 2 has a large area for enhancing heat radiation, but since the heat radiating surface 4a, 2a extends parallel to the printed circuit board 11, 12, the size of the heat radiating surface 4a, 2a does not affect width of the servo amplifier, thus permitting reduction in the width of the amplifier. A flat heat pipe 23 is attached to the heat radiating surface 4a, 2a of the semiconductor module 4, 2, and a heat sink 24 is attached to a portion of the flat heat pipe 23 which is exposed outside from the rear of a unit case 20. This arrangement permits heat generated by the semiconductor module 4, 2 to be conducted to the heat sink 24 and radiated therefrom away from a region in the unit case 20 where the other components are disposed.

The heat sink 24 is produced by die casting or the like as a one-piece structure including a flange 21 for mounting the servo amplifier on a locker or a casing of a controller. The length of the heat sink 24 in the width direction of the unit case 20 is smaller than the width of the unit case 20. Namely, the heat sink 24 is formed such that the width thereof is smaller than the width of the unit case 20. The unit case 20 is provided for preventing electric shock, supporting the printed circuit boards 11 and 12, and improving external appearance, and is securely fixed to the flange 21. In FIG. 4, reference numeral 22 denotes a terminal of the semiconductor module 4, 2.

In conventional servo amplifiers, the width of the amplifier is restricted by height of tall components among components 13 other than the semiconductor module 2, 4, which is for example a relay or an electrolytic capacitor 3, and other components of small height are mounted in spaces not interfering with such tall components. As a result, the width of the servo amplifier is determined by the height of the tallest component among the components mounted on the printed circuit boards 11 and 12.

Further, heat generated by the semiconductor module 4, 2 is radiated from the heat pipe 23 and the heat sink 24, to cool the module 4, 2, but there are some other components of the servo amplifier in the unit case 20 which generate considerable heat and need to be cooled. To cool such components, a fan motor is provided in the amplifier to carry out forced air cooling.

On the other hand, there is requirement of downsizing of apparatus into which the servo amplifier is incorporated, and thus the servo amplifier is desired to be downsized. To downsize the servo amplifier, it is the best way to make the amplifier thinner by reducing its width, in view of mounting compatibility with existing types and also matching in shape with other types. However, if the servo amplifier and thus the unit case thereof are reduced in size, the components of the servo amplifier are densely arranged within the unit case, and heat generating components contained in the unit case need to be cooled with higher efficiency since heat generated by the components adversely affects the other surrounding components.

SUMMARY OF THE INVENTION

An object of the present invention is to provide a servo amplifier of small thickness. A further object of the invention is to provide a downsized and thin servo amplifier capable of efficiently cooling heat generating components therein.

According to the present invention, a semiconductor module constituting an inverter essential to a servo amplifier, and first and second printed circuit boards are arranged so that a heat radiating surface of the semiconductor module and surfaces of the printed circuit boards are parallel to inner wall surfaces of a unit case. Components mounted on the first and second printed circuit boards have heights substantially equal to or smaller than the thickness of the semiconductor module and also the sum of height of parts positioned in confronting relation with each other on the first and second printed circuit boards is made substantially equal to or smaller than the thickness of the semiconductor module, so that a distance between the inner walls of the unit case can be made substantially equal to a total thickness of the semiconductor module and the printed circuit board.

In the case where a heat sink is attached to the heat radiating surface of the semiconductor module, height of components mounted on the printed circuit boards is made substantially equal to or smaller than the sum of the thicknesses of the semiconductor module and the heat sink, and also the distance between the inner walls of the unit case is made substantially equal to the sum of the thicknesses of the semiconductor module, the heat sink and the printed circuit boards. Further, in the case where a flat heat pipe with a heat sink is attached to the heat radiating surface of the semiconductor module and the heat sink is positioned outside the unit case along the same, height of components on the printed circuit boards is made substantially equal to or smaller than the sum of the thicknesses of the semiconductor module and the heat pipe, and the distance between the inner walls of the unit case is made substantially equal to the sum of the thicknesses of the semiconductor module, the heat pipe and the printed circuit boards.

Also, guide plates are provided in the unit case to define air passages so that the flow of air produced by fans is forcibly caused to impinge in a concentrated manner on components which need to be cooled, thereby permitting dense arrangement of the components.

BRIEF DESCRIPTION OF THE DRAWINGS

FIGS. 5a and 5b illustrate air flows when a conventional forced air cooling method is applied to the third embodiment, wherein FIG. 5a is an elevation view and FIG. 5b is a bottom view of the servo amplifier for showing an internal arrangement of the servo amplifier;

FIGS. 6a and 6b illustrate air flows by a forced air cooling method according to a fourth embodiment of the present invention, wherein FIG. 6a is an elevation view and FIG. 6b is a bottom view for showing an internal arrangement of the servo amplifier.

DETAILED DESCRIPTION OF THE PREFERRED EMBODIMENTS

Figure 1:
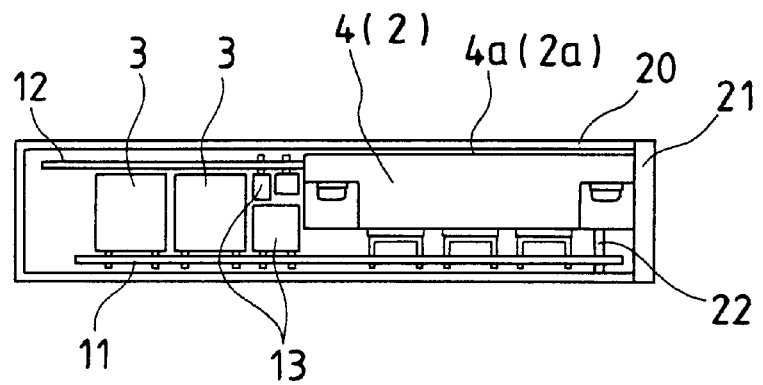
FIG. 1 is a diagram of a servo amplifier according to a first embodiment of the present invention as viewed from its bottom for showing an internal arrangement thereof.
Figure 4:
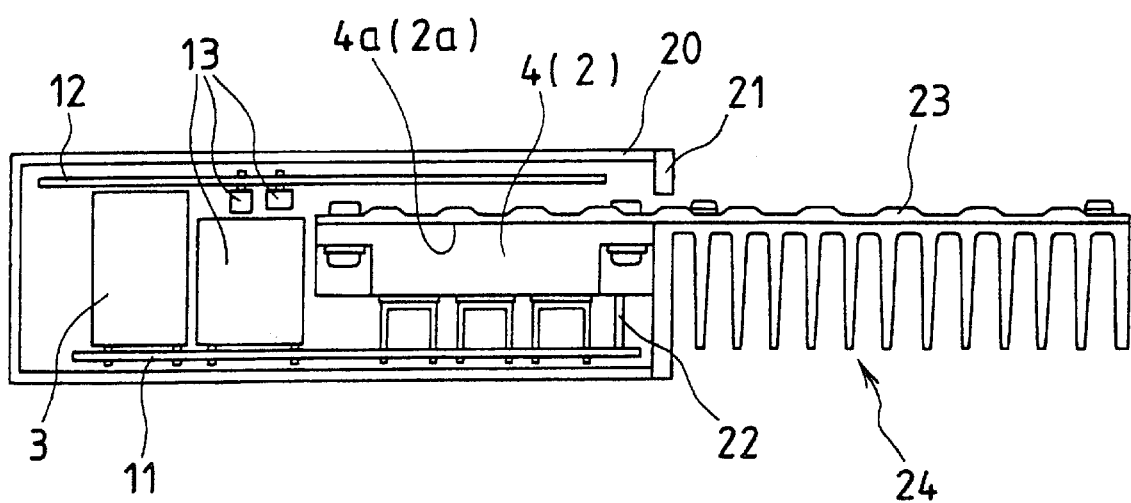
FIG. 4 is a diagram exemplifying a conventional servo amplifier as viewed from its bottom for showing the internal arrangement thereof.

FIG. 1 shows an internal arrangement of a servo amplifier as viewed from its bottom, according to a first embodiment of the present invention. In FIG. 1, identical reference numerals are used to denote components or elements identical with those of the conventional servo amplifier shown in FIG. 4. The first embodiment differs from the conventional servo amplifier shown in FIG. 4 in that the width of the servo amplifier is determined by the thickness of the semiconductor module 4, 2, thereby making the width of the servo amplifier extremely small. The component indispensable to the servo amplifier is the semiconductor module 4 constituting an inverter circuit, and the external shape of the semiconductor module 4 places restrictions on the external shape of the servo amplifier. Consequently, the requirement for minimizing the width of the servo amplifier is that the width or distance between inner walls of the unit case 20 of the servo amplifier should not be greater than a width determined by the thickness (width) of the semiconductor module 4.

In the first embodiment, therefore, the aforementioned components constituting the servo amplifier are separately mounted on two printed circuit boards 11 and 12 which are arranged so as to face each other, as in the conventional servo amplifier. One or both of the semiconductor modules 4 and 2 are mounted on the printed circuit board 11 or 12 such that heat radiating surfaces 4a and 2a thereof are parallel with the printed circuit board 11, 12. In the example shown in FIG. 1, the printed circuit board 11 has a semiconductor module mounted thereon. Other electrical components than the semiconductor module 4, 2, for example, the electrolytic capacitor 3 as well as components in the circuit of FIG. 1 such as resistors and a transformer, are reduced in height or divided into a plurality of parts so that the heights thereof are substantially equal to or smaller than the height of the semiconductor module 4, 2. Further, the components are arranged in such a manner that those components positioned in confronting relation with each other on the printed circuit boards 11 and 12 do not interfere with each other and also that the sum of the heights of such components is smaller than or equal to the height of the semiconductor module 4, 2. Consequently, the maximum value of thickness of the components contained in the unit case 20 is the sum of thickness of the printed circuit board 11 and the semiconductor module 4, 2. Also, a distance between the inner walls of the unit case 20 is set substantially equal to or slightly greater than the sum of thickness of the printed circuit board 11 and semiconductor module 4, 2, thereby reducing the width and thus the size of the servo amplifier.

Figure 2:
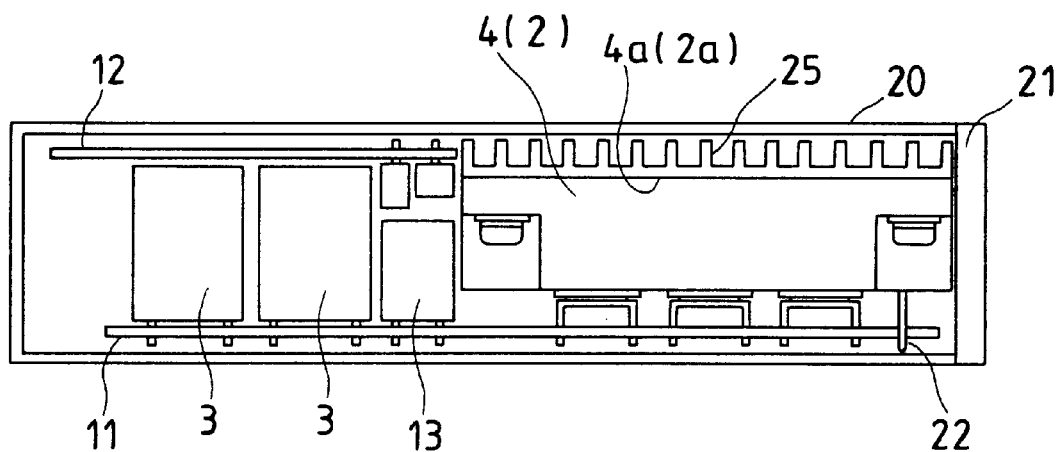
FIG. 2 is a diagram of a servo amplifier according to a second embodiment of the present invention as viewed from its bottom for showing the internal arrangement thereof.

Further, as shown in FIG. 2 which illustrates a second embodiment, a thin heat sink 25 is attached to the heat radiating surface 4a, 2a of the semiconductor module 4, 2 to radiate heat generated by the module 4, 2. In this case, the distance between the inner walls of the unit case 20 is substantially equal to the total thickness of the printed circuit board 11, semiconductor module 4, 2 and the heat sink 25. In the second embodiment, forced air cooling, described later, may be employed to cool the semiconductor module 4, 2 and other servo amplifier components within the unit case that generate heat and thus need to be cooled.

Figure 3:
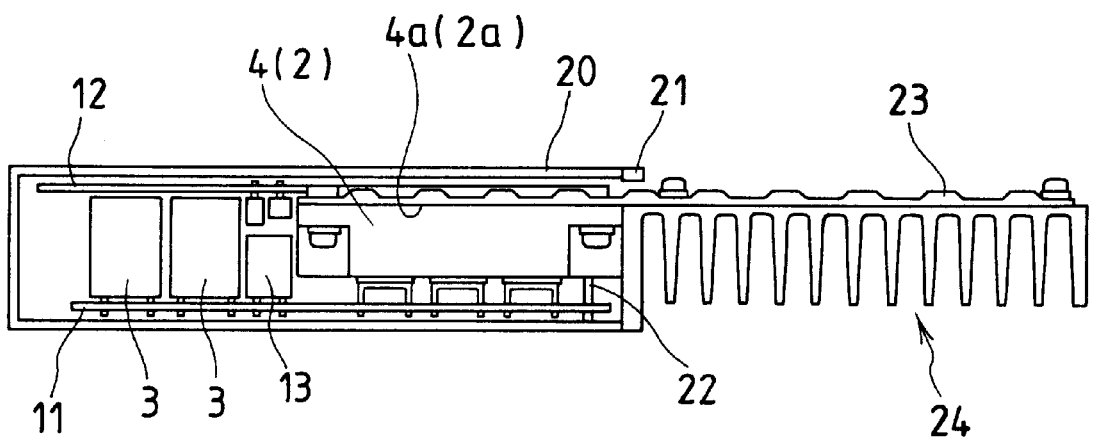
FIG. 3 is a diagram of a servo amplifier according to a third embodiment of the present invention as viewed from its bottom for showing an internal arrangement thereof.

FIG. 3 shows an internal arrangement of a servo amplifier as viewed from its bottom, according to a third embodiment of the present invention. Like the conventional servo amplifier shown in FIG. 4, the third embodiment includes a flat heat pipe 23 and a heat sink 24 which is produced by die casting or the like as a one-piece body having a flange 21 as an integral part thereof, the flat heat pipe 23 being attached to the heat radiating surface 4a, 2a of the semiconductor module 4, 2, while the heat sink 24 being mounted to a portion of the heat pipe 23 extending to the outside from the rear of the unit case 20 so that heat generated by the semiconductor module 4, 2 may be conducted to and dissipated from the heat sink 24. Further, the width of the heat sink 24 in the width direction of the unit case 20 is made smaller than the width of the unit case 20 to allow a plurality of unit cases 20 to be placed one upon another. The construction described above makes it possible to remarkably improve the efficiency in cooling the semiconductor module 4, 2, compared with the first embodiment shown in FIG. 1 or the second embodiment shown in FIG. 2.

The third embodiment is almost identical in construction with the first embodiment except that the flat heat pipe 23 and the heat sink 24 are provided, but the distance between the inner walls of the unit case 20 is determined by the total width (total thickness) of the printed circuit board 11, semiconductor module 4, 2 and flat heat pipe 23 and is set to a width slightly greater than the total width (total thickness). Accordingly, components which are to be mounted in regions of the printed circuit boards other than the region in which the semiconductor module 4, 2 is mounted are suitably selected so that their widths (thicknesses) are smaller than the distance between the inner walls of the unit case 20, and also components such as the electrolytic capacitor 3 are divided into a plurality of parts to be arranged at different positions.

With respect to a power supply unit, there is known Japanese Patent Laid-Open Publication No. 8-80040. The publication mentions a small-sized power supply unit with a height of 5 mm or less and refers to a transformer as a component which determines a limit on height.

Contrary to the above, the present invention is directed to a servo amplifier, and therefore, a semiconductor module determines a limit on height (in the present invention, width). This is because the servo amplifier is very often expected to handle high voltage and large current and thus the semiconductor module needs to have high withstand voltage and high heat dissipation property, inevitably enlarging the external shape of the semiconductor module. Although transistors are used as part of the circuitry in Japanese Patent Laid-Open Publication No. 8-80040, they can be made flat or be divided and do not place the limit on height.

As opposed to the height of the power supply unit of 5 mm or less mentioned in the above publication, the width of a servo amplifier is approximately 50 mm, and there is apparently a large difference.

Further, the servo amplifier requires various circuits and thus a large number of components, and reduction in the volume of the amplifier makes it necessary to mount the components separately on a plurality of printed circuit boards. Also in this case, there are special restrictions imposed on the servo amplifier, for example, the printed circuit boards need to be arranged so as to face each other, the total height of components positioned in confronting relation with each other on the printed circuit boards should not exceed the height of the semiconductor module.

A servo amplifier according to another embodiment wherein an improved forced air cooling method is employed to permit reduction of size will be described.

FIGS. 5*a* and 5*b* illustrate air flows observed when a conventional forced air cooling method is applied to the servo amplifier of the third embodiment described above.

It is assumed that, in FIGS. 5*a* and 5*b,* components 13*a* and 13*b,* besides the semiconductor module 4, 2, are the components that require air cooling. With the conventional air cooling method, air is introduced from one side of the unit case 20 and discharged via fans 15 on the other side of the unit case, and in this case, air flows through the entire region of the unit case 20, as indicated by the broken lines in FIG. 5*a*. Since, in particular, a smaller gap has a greater flow resistance, a larger amount of air tends to flow through a greater gap.

Figures 6A, 6B:
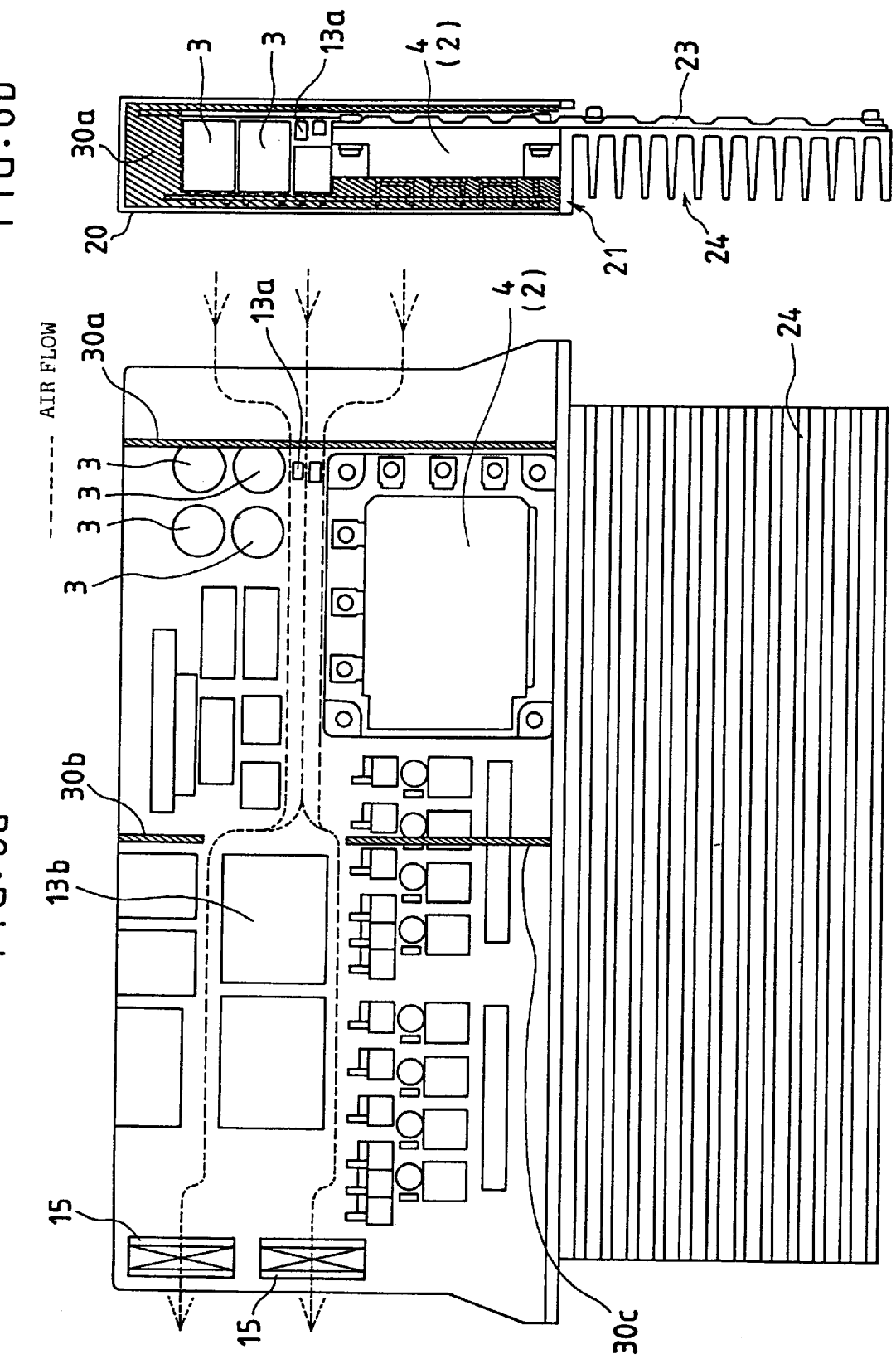
Figure 7:
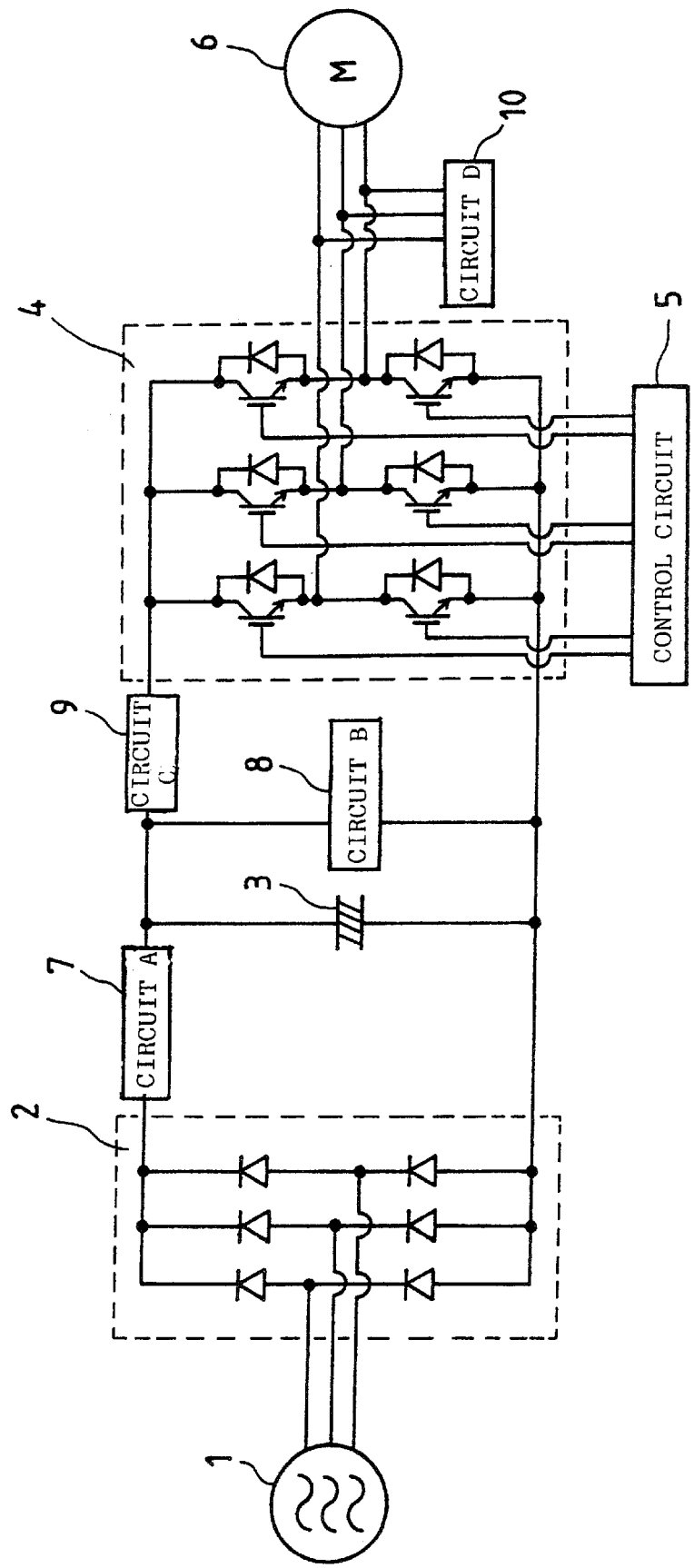
FIG. 7 is a diagram showing a circuitry structure of the servo amplifier.

To improve the forced air cooling effect, according to the fourth embodiment of the present invention, air passages are defined with the use of arrangement of the components and guide plates 30*a,* 30*b* and 30*c* (hatched in FIGS. 6*a* and 6*b*), as shown in FIGS. 6*a* and 6*b,* so that a larger amount of air may impinge upon the components 13*a* and 13*b* which need to be cooled.

On the air inlet of the unit case 20 shown in FIG. 6*b,* the guide plate 30*a* is formed on the unit case 20 or the flange 21 in such a manner as to close gaps between side walls of the unit case 20 and the components to concentrate air flow to the component 13*a* requiring cooling as well as to the heat radiating surface of the semiconductor module 4, 2 (surface of the heat pipe 23) to allow a large amount of air to impinge upon these components. Also, the guide plates 30*b* and 30*c* are arranged in the interior of the unit case 20 in such a manner as to close gaps between the component 13*b,* which also is arranged inside the unit case and needs to be cooled, and other components to concentrate air may flow to the component 13*b* to allow a large amount of air to impinge thereupon.

Consequently, air flows, due to the action of the fans 15, toward the component 13*a* requiring cooling and the heat radiating surface of the semiconductor module 4, 2 (surface of the heat pipe 23) while being guided by the guide plate 30*a,* as indicated by the broken lines in FIG. 6*a*. Then, inside the unit case 20, the air flows to the component 13*b* requiring cooling in a concentrated manner, while the flow thereof is restricted by the guide plates 30*b* and 30*c* and the components, and is discharged to the outside of the unit case 20 by the fans 15.

Thus, air is forcibly caused to flow in a concentrated manner to the regions where the components requiring air cooling are arranged, whereby the cooling effect is enhanced, permitting the components to be densely arranged within the unit case 20 and also the servo amplifier to be reduced in size. Especially, as shown in FIG. 6, the width or distance between the inner walls of the unit case 20 is set to a width determined by the total thickness of the printed circuit board 11, semiconductor module 4, 2 and heat pipe 23, and also the air passages are defined with the use of the arrangement of the components and the guide plates so that air may concentratedly impinge upon the components that need to be cooled, whereby the air cooling effect is enhanced and the servo amplifier can be reduced in thickness and thus in size.

In the foregoing embodiments, two printed circuit boards 11 and 12 are used by way of example, but a single printed circuit board or three or more subdivided boards may alternatively be used. Further, although in the above embodiments only one semiconductor module is illustrated, the present invention is applicable also in cases where a plurality of semiconductor modules are provided.

According to the present invention, the width or distance between the inner walls of the unit case of a servo amplifier is determined by the thickness of a semiconductor module which is indispensable to the servo amplifier, and the other components are arranged so that their heights may be smaller than the above width, whereby the thickness of the servo amplifier can be minimized, making it possible to provide a thin servo amplifier. Also, air passages are defined so that air may flow concentratedly to the semiconductor module and other components requiring cooling to forcibly cool them by means of fans, whereby the cooling effect is enhanced, permitting dense arrangement of the components and reduction in size of the servo amplifier.

What is claimed is:

1. A servo-amplifier, comprising:
    a semiconductor module;
    a first printed circuit board on which the semiconductor module and components are mounted;
    a second printed circuit board on which the semiconductor module is not mounted and on which components are mounted; and
    a unit case accommodating said semiconductor module, said first printed circuit board and said second printed circuit board, wherein said first printed circuit board and said second printed circuit board are placed opposite to each other, a heat radiating surface of said semiconductor module, said first printed circuit board and said second printed circuit board are arranged parallel to inner wall faces of the unit case, respective heights of each of the components mounted on said first printed circuit board and said second printed circuit board are equal to or smaller than a thickness of said semiconductor module, a sum of heights of components positioned in confronting relation with each other on said first printed circuit board and second printed circuit board are equal to or smaller than the thickness of said semiconductor module, and a distance between the inner walls of said unit case is substantially equal to a sum of thicknesses of said semiconductor module and said first printed circuit board.

2. A servo-amplifier according to claim 1, wherein said semiconductor module includes a heat sink attached to the heat radiating surface thereof, respective heights of the components mounted on said first printed circuit board and said second printed circuit board are equal to or smaller than a thickness of said semiconductor module including the attached heat sink, the sum of heights of components positioned in confronting relation with each other on said first printed circuit board and second printed circuit board is substantially equal to or smaller than the thickness of said semiconductor module including the attached heat sink, and a distance between the inner walls of said unit case is substantially equal to sum of thickness of said semiconductor module including the heat sink, and said first printed circuit board.

3. A servo-amplifier according to claim 1, wherein said semiconductor module includes a heat sink having a flat heat pipe attached to the heat radiating surface thereof, respective heights of each of the components mounted on said first printed circuit board and said second printed circuit board are equal to or smaller than a thickness of said semiconductor module including the heat sink having the flat heat pipe, the sum of heights of components positioned in confronting relation with each other on the first printed circuit board and the second printed circuit board is equal to or smaller than the thickness of said semiconductor module including the heat sink having the flat heat pipe, and a distance between the inner walls of said unit case is substantially equal to a sum of respective thicknesses of said semiconductor module including the heat sink having the flat heat pipe and said first printed circuit board.

4. A servo-amplifier according to claim 1, further comprising a cooling fan and a guide plate, wherein said cooling fan and said guide plate are arranged in said unit case to form a pathway for air, which pathway concentrates cooling air generated by said cooling fan on components requiring cooling.

* * * * *